(12) United States Patent
Yun

(10) Patent No.: US 7,598,550 B2
(45) Date of Patent: Oct. 6, 2009

(54) MOS TRANSISTOR AND MANUFACTURING METHOD THEREOF

(75) Inventor: Hyung Sun Yun, Buchun-shi (KR)

(73) Assignee: Dongbu Electronics Co., Ltd., Seoul (KR)

(*) Notice: Subject to any disclaimer, the term of this patent is extended or adjusted under 35 U.S.C. 154(b) by 36 days.

(21) Appl. No.: 11/320,629

(22) Filed: Dec. 30, 2005

(65) Prior Publication Data

US 2007/0158742 A1    Jul. 12, 2007

(30) Foreign Application Priority Data

Nov. 21, 2005    (KR) ........................ 10-2005-0111180

(51) Int. Cl.
*H01L 29/76* (2006.01)
(52) U.S. Cl. ........................ 257/288; 257/330; 257/333; 257/347; 257/353; 257/E29.255
(58) Field of Classification Search ............... 257/72, 257/288, 330, 333, 347, 353
See application file for complete search history.

(56) References Cited

U.S. PATENT DOCUMENTS

| | | | | |
|---|---|---|---|---|
| 3,730,778 A | * | 5/1973 | Shannon et al. ............. | 438/374 |
| 7,095,077 B2 | * | 8/2006 | Kataoka et al. ............. | 257/324 |
| 7,119,435 B2 | * | 10/2006 | Lee .............................. | 257/714 |
| 7,145,172 B2 | * | 12/2006 | Peng et al. .................... | 257/52 |
| 2002/0014626 A1 | * | 2/2002 | Nakajima et al. ............. | 257/59 |
| 2002/0185684 A1 | * | 12/2002 | Campbell et al. ............ | 257/347 |
| 2004/0152272 A1 | * | 8/2004 | Fladre et al. ................. | 438/284 |

FOREIGN PATENT DOCUMENTS

KR    10 1997 0005704 B1    4/1997
KR         10 0474388 B1    2/2005

OTHER PUBLICATIONS

Office Action from the Korean Intellectual Property Office, dated Nov. 17, 2006, in counterpart Korean Patent Application No. 10-2005-0111180.

* cited by examiner

*Primary Examiner*—Wai-Sing Louie
(74) *Attorney, Agent, or Firm*—Finnegan, Henderson, Farabow, Garrett & Dunner, L.L.P.

(57) ABSTRACT

There are provided a MOS transistor and a manufacturing method thereof. The MOS transistor includes a substrate on which an insulating layer is formed, a gate embedded in the insulating layer, wherein the top surface of the gate is exposed, a gate oxide layer formed on the insulating layer and the gate, a silicon layer formed on the gate oxide layer, and a source region and a drain region formed in the silicon layer to be in contact with the gate oxide layer.

9 Claims, 4 Drawing Sheets

MOS TRANSISTOR AND MANUFACTURING METHOD THEREOF

BACKGROUND OF THE INVENTION

1. Field of the Invention

The present invention relates to a semiconductor device, and more particularly, to a metal oxide semiconductor (MOS) transistor and a manufacturing method thereof.

2. Description of the Related Art

A related art metal oxide semiconductor (MOS) transistor will be described with reference to FIG. 1.

FIG. 1 is a cross-sectional view of a related art MOS transistor 100.

In general, according to a process of forming an NMOS transistor, an oxide such as a shallow trench isolation (STI) 20 is formed in a p-type substrate 10 to isolate devices from each other, and then an impurity is implanted so as to form a well 30. A thin gate oxide layer 40 is formed on the substrate 10 in which the well 30 is formed. Thereafter, polysilicon is deposited on the resultant structure, and then is etched to form a gate 50. Thereafter, an impurity is implanted again into the substrate 10 on both sides of the gate 50 so as to form a source region 60 and a drain region 70, respectively.

The related art MOS transistor 100 is configured such that a channel is formed by applying a predetermined voltage to the gate 50, and a driving current flows by applying a certain voltage to the drain region 40.

Meanwhile, the related art MOS transistor 100 is manufactured of a silicon wafer in hundreds of micrometers thick. However, a portion of the silicon wafer used as a semiconductor device is only a region in tens of micrometers or less deep from the top surface thereof, whereas the other region is used as only the substrate for supporting the semiconductor device.

However, due to the region of the substrate for supporting the semiconductor device, which is referred to as the region for a support substrate in brief, an excessive power is consumed. Moreover, due to a parasitic effect, e.g., the driving speed of the semiconductor device being degraded, caused by the region for the support substrate, there is such a serious problem that it becomes an obstacle to the function of the semiconductor device in the long run.

SUMMARY OF THE INVENTION

Accordingly, the present invention is directed to a metal oxide semiconductor (MOS) transistor and a manufacturing method thereof that substantially obviates one or more problems due to limitations and disadvantages of the related art.

An object of the present invention is to provide a MOS transistor with low power and high-speed performance by preventing a parasitic effect due to a support substrate of the MOS transistor, and a manufacturing method thereof.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a MOS transistor including: a substrate on which an insulating layer is formed; a gate embedded in the insulating layer, wherein the top surface of the gate is exposed; a gate oxide layer formed on the insulating layer and the gate; a silicon layer formed on the gate oxide layer; and a source region and a drain region formed in the silicon layer to be in contact with the gate oxide layer.

In another aspect of the present invention, there is provided a MOS transistor including: an insulating substrate; a gate embedded in the insulating substrate, wherein the top surface of the gate is exposed; a gate oxide layer formed on the insulating substrate and the gate; a silicon layer formed on the gate oxide layer; and a source region and a drain region formed in the silicon layer to be in contact with the gate oxide layer.

In a further another aspect of the present invention, there is provided a method for manufacturing a MOS transistor, including: preparing a substrate; forming an insulting layer on the substrate, and forming a gate in the insulating layer, wherein the top surface of the gate is exposed; forming a gate oxide layer on the insulating layer and the gate; forming a silicon layer on the gate oxide layer; and forming a source region and a drain region in the silicon layer on both sides of the gate such that the source and drain regions are in contact with the gate oxide layer.

In a still further another aspect of the present invention, there is provided a method for manufacturing a MOS transistor, including: preparing a substrate, wherein a gate is embedded in an upper portion of the substrate; forming a silicon layer on which a gate oxide layer is formed; bonding the top surface of the substrate and the top surface of the silicon substrate together; and forming a source region and a drain region in the silicon layer by implanting impurities such that the source and drain regions are in contact with the gate oxide layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

First Embodiment

Figure 1:
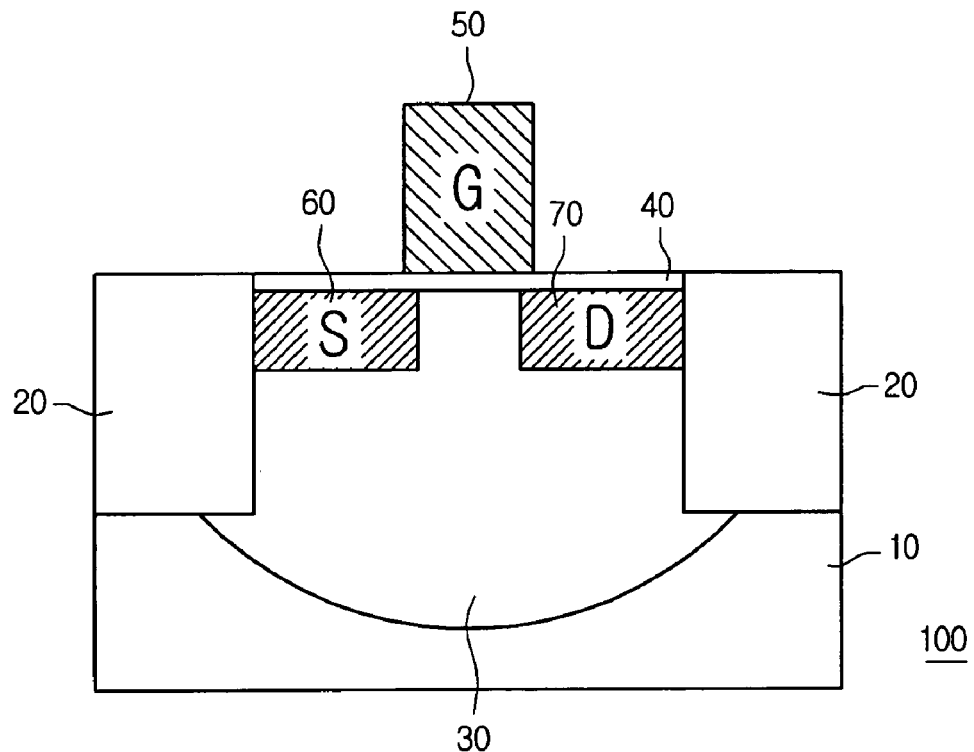
FIG. 1 is a cross-sectional view of a related art MOS transistor.
Figure 2:
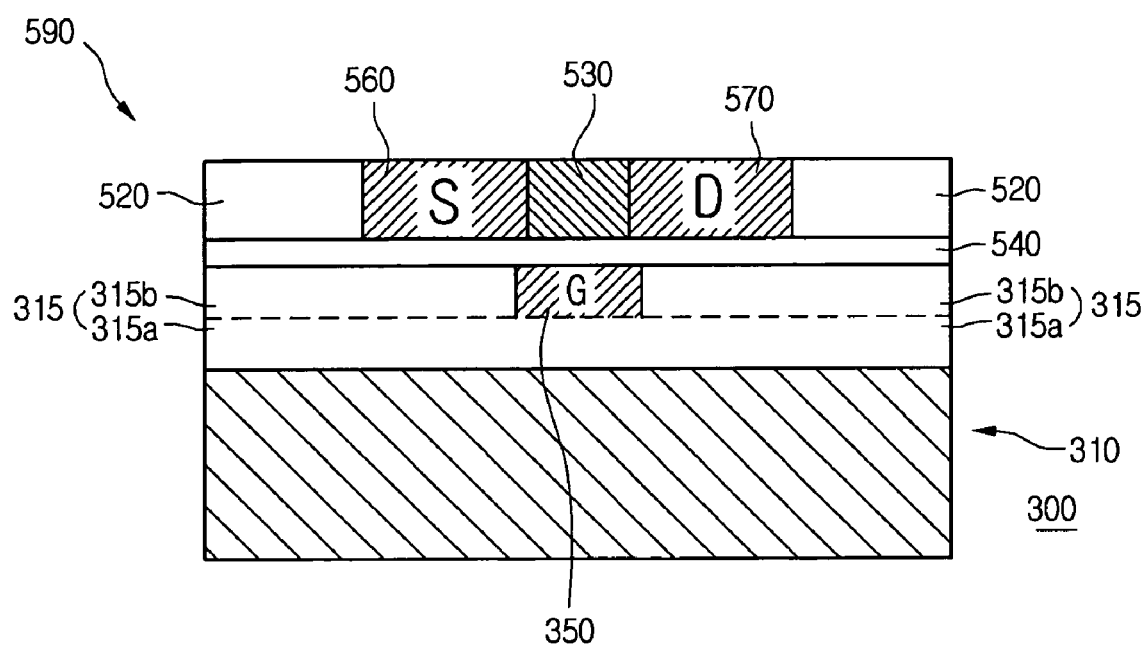
FIG. 2 is a cross-sectional view of a MOS transistor according to a first embodiment of the present invention.

FIG. 2 is a cross-sectional view of a MOS transistor according to a first embodiment of the present invention.

The MOS transistor 300 according to the first embodiment of the present invention includes a substrate 310, a gate 350, a gate oxide layer 540, a silicon layer 590, a source region 560, and a drain region 570. Herein, an insulating layer 315 is formed on the substrate 310. The gate 350 is embedded in the insulating layer 315, wherein a top surface of the gate 350 is exposed. The gate oxide layer 540 is formed on the insulating layer 315 and the gate 350. The silicon layer 590 is formed on the gate oxide layer 540. The source and drain regions 560 and 570 are formed in the silicon layer 590 to be in contact with the gate oxide layer 540.

The insulating layer 315 is provided with a first insulating layer 315a formed on the substrate 310, and a second insulating layer 315b formed on the first insulating layer 315a. The gate 350 may be formed on the first insulating layer 315a, as being embedded in the second insulating layer 315b. It is preferable that the gate 350 should not be in contact with the substrate 310 in order to prevent a parasitic component of the substrate 310.

In addition, the insulating layer 315 may be an insulating layer of a single layer formed on the substrate 310. In this case, the gate 350 should be formed such that the bottom surface thereof is not in contact with the top surface of the substrate 310 for preventing the parasitic component.

Although it is illustrated in FIG. 2 as if the top surface of the gate 350 seems to be equal in height to the top surface of the insulating layer 315, the gate 350 may be formed such that the top surface thereof is higher or lower than the top surface of the insulating layer 315. According to the location of the gate 350, a shape of the gate oxide layer 540 may be variously altered correspondingly.

A method of manufacturing the MOS transistor 300 according to the first embodiment of the present invention will be illustrated more fully in detail with reference to FIGS. 3A to 3G herebelow. The manufacturing method of the first embodiment of the present invention utilizes a wafer bonding technique.

The method of manufacturing the MOS transistor 300 includes: a) preparing the substrate 310, wherein the gate 350 is embedded in an upper portion of the substrate 310; b) preparing a silicon layer 590 on which the gate oxide layer 540 is formed; c) bonding the top surface of the substrate 310 and the top surface of the silicon layer 590 together; d) and forming the source region 560 and the drain region 570 to be in contact with the gate oxide layer 540 by implanting an impurity into the silicon layer 590 on both sides of the gate 350.

The operation a) will be set forth in detail with reference to FIGS. 3A to 3C.

The operation a) may include: forming the first insulating layer 315a on the substrate 310 by thermal oxidation; depositing the polysilicon on the first insulating layer 315a and etching it, to thereby form the gate 350; and forming the second insulating layer 315b in which the gate 350 is embedded such that the top surface thereof is exposed.

Figure 3A:
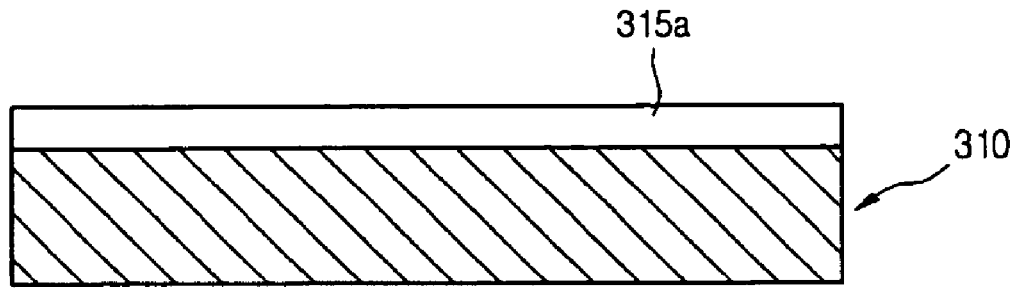
FIGS. 3A to 3G are cross-sectional views illustrating a method of manufacturing the MOS transistor according to the first embodiment of the present invention.

To begin with, referring to FIG. 3A, the first insulating layer 315a is formed by thermally oxidizing the surface of the substrate 310.

Figure 3B:
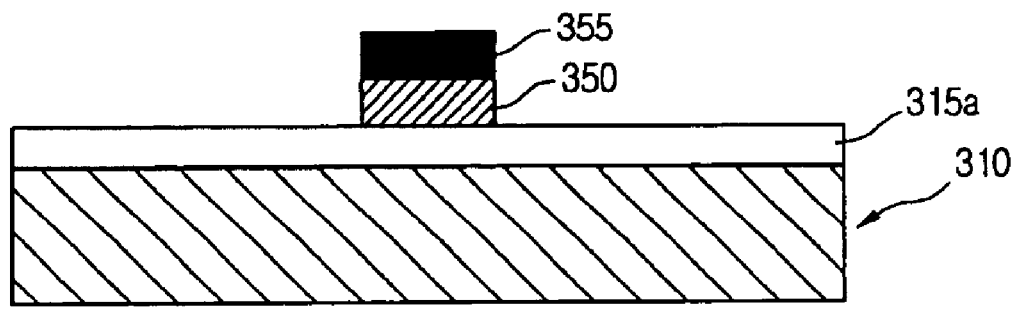

Thereafter, referring to FIG. 3B, after depositing polycrystalline silicon on the first insulating layer 315a, a photoresist layer (not shown) is patterned so as to form a photoresist pattern 355. Next, the polycrystalline silicon is etched to form the gate 350, and then the photoresist pattern 355 is removed.

Figure 3C:
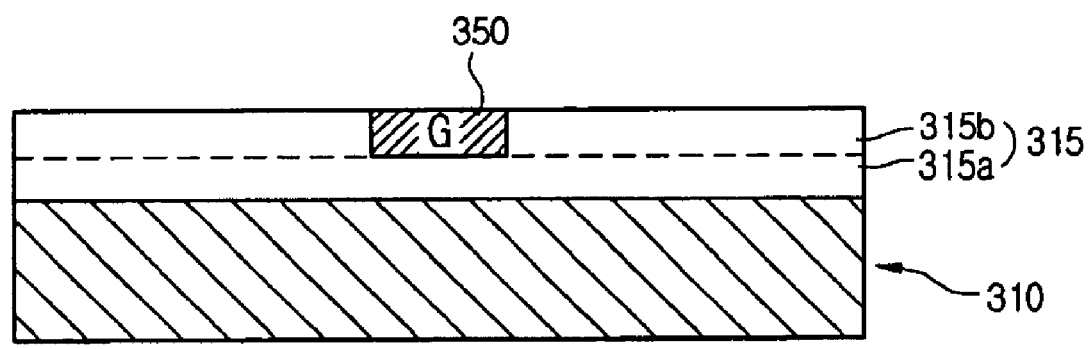

Afterwards, referring to FIG. 3C, the second insulating layer 315b is formed such that the gate 350 is embedded therein, wherein the top surface of the gate 350 is exposed.

Although it is illustrated in FIG. 3C as if the top surface of the gate seems to be equal to the top surface of the insulating layer 315, the gate 350 may be formed such that the top surface thereof is higher or lower than the top surface of the insulating layer 315. According to the location of the gate 350, a shape of the gate oxide layer 540 may be variously altered correspondingly.

After forming the second insulating layer 315b, the operation a) may further include planarizing the gate 350 and the insulating layer 315.

In addition, after forming the second insulating layer 315b, the operation a) may further include cleaning the gate 350 and the insulating layer 315.

Figure 3D:
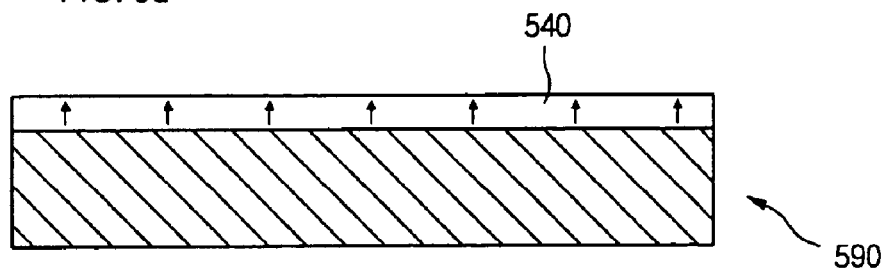

Thereafter, referring to FIG. 3D, the gate oxide layer 540 is formed on the silicon layer 590, which is separately performed from the preparing of the substrate 310. The gate oxide layer 540 may be formed by growing a material with a high dielectric constant, i.e., a high-k material. Because the gate oxide 540 is formed of the high-k material, it is effective for preventing reliability of the insulating layer from being degraded when the gate oxide layer 540 becomes in contact with the source and drain regions 560 and 570 in a following bonding process.

Figure 3E:
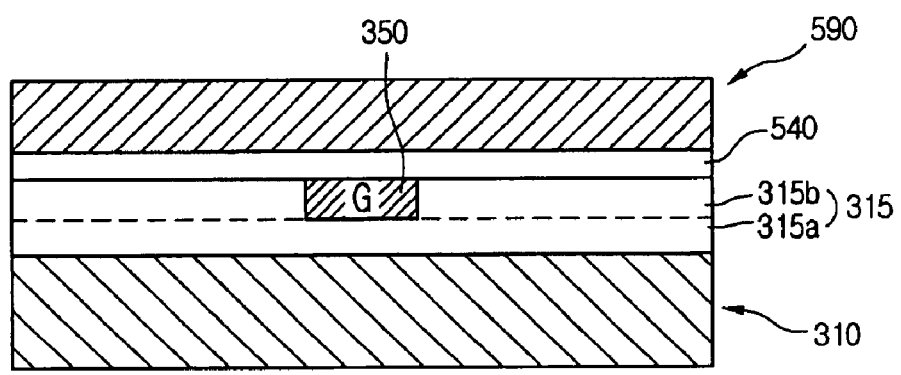

Subsequently, referring to FIG. 3E, the top surface of the substrate 310 is bonded together with the top surface of the silicon layer 590. The operation c) may include: provisionally bonding the top surface of the substrate 310 and the top surface of the silicon layer 590 together; and completely bonding the substrate 310 and the silicon layer 590 by heating them at a predetermined temperature or higher. It is preferable to determine the predetermined temperature at which atoms in each insulating layer 315, the gate 350 and the gate oxide layer 540 are electrically activated, and diffuse into three-dimensional space so as to form their magnetic regions.

Alternatively, the operation c) may include: rinsing the substrate 310 and the silicon layer 590; drying the substrate 310 and the silicon layer 590; and completely bonding the substrate 310 and the silicon layer 590 by heating them at a predetermined temperature or higher.

In the method of the first embodiment of the present invention, the substrate 310 and the silicon layer 590 are completely bonded together by heating them at atmospheric pressure in nitrogen ambient at a temperature in a range of about 1,000° C. to 1,200° C. for 2~6 hours. Meanwhile, it is noticed that the temperature and the time are not construed as being limited to the above, but they may be embodied in many different forms under various circumstances.

Figure 3F:
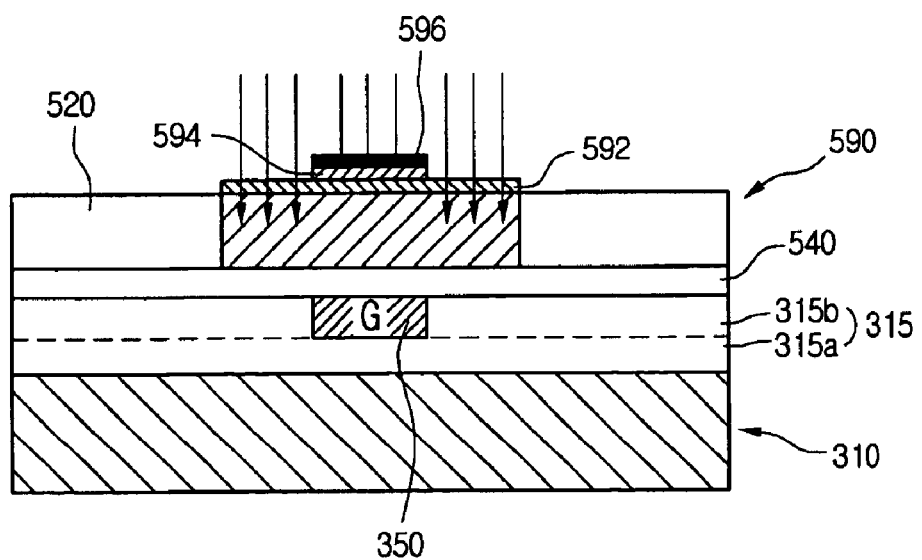

Thereafter, referring to FIG. 3F, an impurity is implanted into the silicon layer 590 on both sides of the gate 350 so as to form the source and drain regions 560 and 570 to be in contact with the gate oxide layer 540.

The forming of the source and drain regions 560 and 570 may include: forming an isolation region 520 except an active region of the silicon layer 590 through etching process; forming an oxide layer and a nitride layer 594 on the active region in sequence; etching the nitride layer 594 after forming a photoresist layer 596; forming the source and drain regions 560 and 570 by implanting impurities into the active region of the silicon layer 590.

Figure 3G:
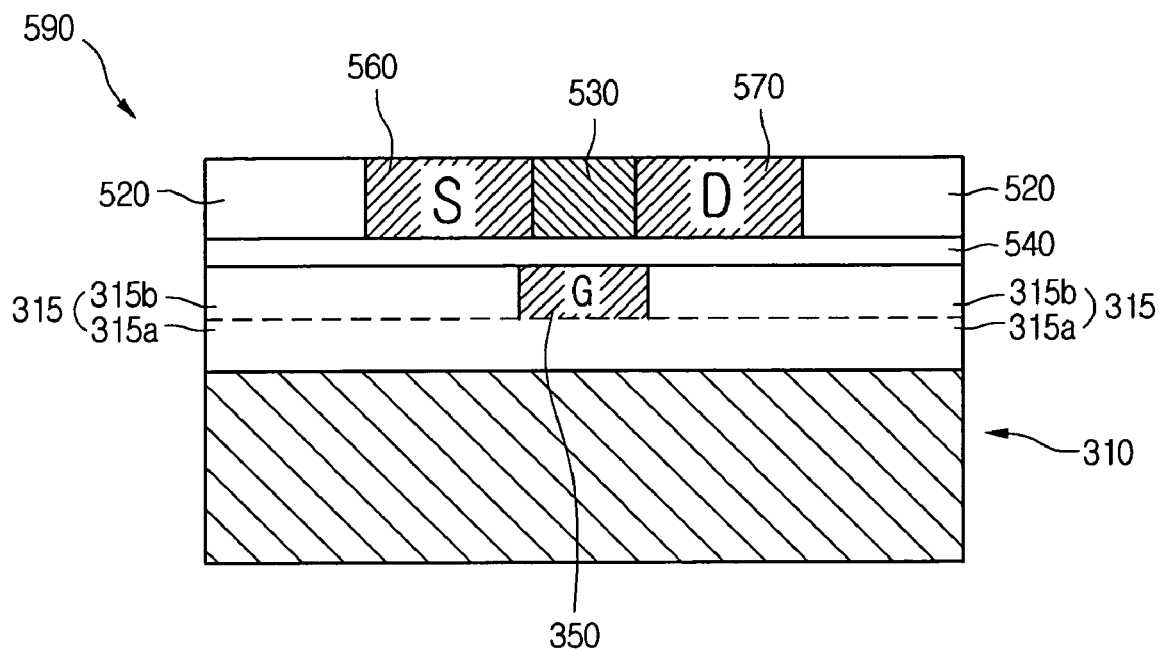

Afterwards, referring to FIG. 3G, the photoresist layer 596, the nitride layer 594 and the oxide layer 592 are removed in sequence.

Also, a thermal treatment may be further performed on the substrate 310 and the silicon layer 590 so as to form an oxide layer (not shown) for activating the source and drain regions 560 and 570 and protecting the surface of the silicon layer 590.

According to the MOS transistor and the method of manufacturing the same, since the semiconductor device having the gate, the source region and the drain region, is separated from the support substrate through the insulating material, the leakage current and the parasitic component due to the support substrate can be eliminated so that it is possible to enhance the speed of the semiconductor device. In addition, because it is unnecessary for supplying the excessive power to the support substrate, it is possible to accomplish the lower power performance. In consideration of a structural aspect, it is not needed to form the well in the substrate so that it is effective for increasing the degree of integration.

Second Embodiment

In a method of forming a MOS transistor according to a second embodiment of the present invention, a gate oxide layer 540 is not formed on a silicon layer 590, unlike the first embodiment.

The method according to the second embodiment of the present invention includes: a) preparing a substrate, wherein a gate is embedded in an upper portion of the substrate; b) preparing a silicon layer; c) bonding the top surface of the substrate and the top surface of the silicon layer together; and d) forming the source region and the drain region to be in contact with the gate oxide layer by implanting an impurity into the silicon layer on both sides of the gate.

During the process of bonding the top surface of the substrate and the top surface of the silicon layer together, an oxide layer is formed therebetween by thermally oxidizing the substrate and the silicon layer. In addition, there occurs a vacuum state partially between the substrate and the silicon layer by means of consumption of an oxidative species gas. This vacuum state makes the substrate and the silicon layer attract each other to be bonded together.

Third Embodiment

In a method of forming a MOS transistor according to a third embodiment of the present invention, an oxide layer is formed on a substrate in which a gate is embedded in an upper portion thereof, unlike the first embodiment 300.

The method according to the third embodiment of the present invention includes: a) preparing a substrate having a gate oxide layer formed thereon, wherein a gate is embedded in an upper portion of the substrate; b) preparing a silicon layer; c) bonding the top surface of the substrate and the top surface of the silicon layer together; d) and forming the source region and the drain region to be in contact with the gate oxide layer by implanting an impurity into the silicon layer on both sides of the gate.

The operation c) is performed by contacting the substrate and the silicon layer with each other, and bonding them together by applying a predetermined voltage to them at a temperature in a range of about 1,000° C. to 1,500° C.

In addition, if the degree of vacuum is heightened in the bonding process, it is possible to perform the bonding process of the substrate and the silicon layer at a room temperature because air existing therebetween is exhausted.

Fourth Embodiment

A method of forming a MOS transistor according to a fourth embodiment of the present invention, unlike the first embodiment, utilizes a technique for electrically isolating the silicon layer and the substrate from each other by forming a buried oxide in virtue of implanting oxygen or nitrogen ions into a deep position of the substrate using high energy or high current.

The method according to the fourth embodiment of the present invention will be set forth with reference to FIG. 4 herebelow.

Figure 4:
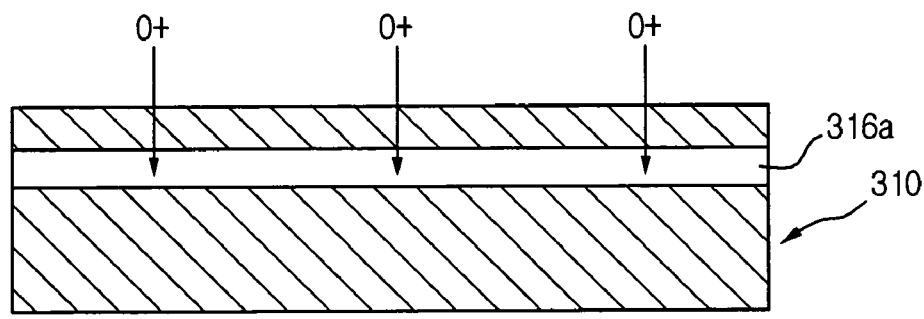
FIG. 4 is a cross-sectional view illustrating a method of manufacturing a MOS transistor according to a second embodiment of the present invention.

Referring to FIG. 4, impurity ions are implanted into the substrate 310 to a predetermined depth from the top surface, and then a heat treatment is performed to form a first insulating layer 316a.

The first insulating layer 316a with a desired thickness may be formed at a predetermined position of the substrate 310 by adjusting the ion implantation dose and the temperature of the heat treatment.

For instance, the first insulating layer 316a may be formed in 90~150 nm thick at about 150~200 nm deep from the top surface of the substrate 310 in case of implanting ions with the dose of $4 \times 10^{17}$~$1 \times 10^{18}$ ions/cm$^2$.

Meanwhile, the heat treatment after the ion implantation may be performed through two steps. That is, a first heat treatment may be performed first at about 1,000° C. or more in inert gas ambient, e.g., argon gas or the like. Thereafter, a second heat treatment may be performed at high temperature in mixed gas ambient in which 30~60% oxygen gas is mixed with an inert gas.

Afterwards, a gate patterning and etching processes are performed on the substrate 310 over the first insulting layer 316a so as to form a gate (not shown). It is preferable to form the substrate 310 of polysilicon. Subsequently, a second insulating layer (not shown) is formed such that the gate pattern is embedded in the second insulating layer and the top surface of the gate pattern is exposed.

Thereafter, like the first embodiment, there may performed following processes: preparing a silicon layer on which a gate oxide layer is formed; bonding the top surface of the substrate and the top surface of the silicon layer together; and forming the source region and the drain region in the silicon layer.

According to the method of the fourth embodiment, the additional deposition and etching process of the polysilicon may be omitted in preparing the substrate where the gate is embedded. Instead of these processes, the substrate 310 itself is patterned and etched to form the gate, after forming the first insulating layer 316a by implanting ions into the polysilicon substrate 310. Therefore, the manufacturing process becomes too simple so that this inventive method is effective for cost reduction and time-saving.

Furthermore, the method of the fourth embodiment of the present invention may be applicable to an integrated circuit for power supply, a communication circuit or the like, where a low voltage control circuit and a high voltage device are integrated together. Moreover, the method of the fourth embodiment has an advantageous merit that it may be applicable to an electronic system device for the military requiring high speed and low power performance with high reliability which can be operable at wide temperature range.

Fifth Embodiment

In a method of forming an NMOS transistor according to a fifth embodiment, the preparing of the substrate in which the gate is embedded is different from that of the first embodiment.

The preparing of the substrate in which the gate is embedded in the fifth embodiment, may include: forming the insulating layer on the substrate; etching the insulating layer by a predetermine width such that the top surface of the substrate is not exposed; and depositing the polysilicon on the etched insulating layer to thereby form the gate.

In the method of the fifth embodiment of the present invention, after the insulating layer is formed as a single layer, which is different from the insulating layer 315 of the double layer in the first embodiment, the gate is formed through etching the insulating layer of the single layer.

Sixth Embodiment

In the method of forming an NMOS transistor according to a sixth embodiment of the present invention, the substrate employs an insulating substrate, unlike the MOS transistor 300 of the first embodiment.

The MOS transistor having the double gate according to the sixth embodiment of the present invention includes an insulating substrate, a gate, a gate oxide layer, a silicon layer, a source region, and a drain region. Herein, the gate is embedded in the insulating substrate, wherein a top surface of the gate is exposed. The gate oxide layer is formed on the insulating substrate and the exposed gate. The silicon layer is formed on the gate oxide layer. The source and drain regions are formed in the silicon layer to be in contact with the gate oxide layer.

The insulating substrate is provided with a first insulating layer of a plane surface, and a second insulating layer formed on the first insulating layer. The gate is embedded in the second insulating layer and may be formed on the first insulating layer.

The insulating substrate may be an insulating layer of a single layer. The gate may be formed such that it is not exposed to a lower portion of the insulating substrate.

According to the sixth embodiment, since the process of forming the insulating layer on the substrate may be omitted because of using the insulting substrate as the substrate, the MOS transistor of the sixth embodiment is effective for reducing manufacturing cost and saving process time.

According to the present invention as described above, it is effective for implementing the MOS transistor with high speed and lower power performance in comparison with the related art because the region for the semiconductor device may be protected by excluding bad effects, i.e., parasitic effects, of the support substrate by means of the insulating material. Accordingly, the inventive method can be variously applied to a method for manufacturing a semiconductor device requiring high speed, high integration and lower power consumption such as a communication semiconductor device, e.g., a mobile phone or the like, and a notebook computer.

In addition, the present invention is applicable to the development of a semiconductor device using a structural characteristic of the substrate itself such as a micro electro mechanical system (MEMS) or the like.

The above method is correspondent to a front end of the line (FEOL) in which a substrate is processed through oxidation or diffusion, among various wafer-processing processes in the semiconductor manufacturing process. After manufacturing the MOS transistor according to the embodiments of the present invention, there may be performed a back end of the line (BEOL) in which an interconnection is formed for connecting a via to the gate by patterning the insulating layer.

While the present invention has been described with respect to certain preferred embodiments, it will be apparent to those skilled in the art that various changes and modifications may be made without departing from the spirit and scope of the invention as defined in the following claims.

That is, besides the method for insulating the substrate and the silicon layer from each other which is used for the embodiments, the insulating method may be employ another method such as a dielectric isolation using the oxide layer as a dielectric material, a silicon on sapphire (SOS) using sapphire ($Al_2O_3$) as the substrate, or the like.

As stated above, according to the MOS transistor and the manufacturing method thereof, the semiconductor device having a gate, the source region and the drain region is separated from the support substrate through the insulating material so that it is possible to eliminate the leakage current and the parasitic component. Therefore, it is effective for enhancing the speed of the semiconductor device.

In addition, according to the present invention, the semiconductor device having a gate, the source region and the drain region is separated from the support substrate through the insulating material so that it is possible to reduce power consumption because it is unnecessary for supplying an excessive power to the support substrate.

Furthermore, according to the present invention, it is not needed to form the well in consideration of a structural aspect, it is effective for increasing the degree of integration.

Additionally, the present invention can be variously applied to the manufacture of a semiconductor device requiring high speed, and lower power consumption such as a communication integrated circuit (I.C.), a notebook computer and so on.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A MOS transistor comprising:
    a substrate on which an insulating layer is formed, wherein the insulating layer is formed on an entire top surface of the substrate;
    a gate embedded in the insulating layer, wherein a top surface of the gate is not covered by the insulating layer and wherein a bottom surface of the insulating layer is lower than a bottom surface of the gate, wherein the gate is formed in a trench in the insulating layer;
    a gate oxide layer formed on top of the insulating layer and the gate, wherein the top surface of the gate is in contact with the gate oxide layer;
    a silicon layer formed on the gate oxide layer; and
    a source region and a drain region formed in the silicon layer to be in contact with the gate oxide layer,
    wherein the gate oxide layer is in contact with an entire bottom edge of both the source region and drain region.

2. The MOS transistor according to claim 1, wherein the insulating layer includes:
    a first insulating layer formed on the substrate; and
    a second insulating layer formed on the first insulating layer,
    wherein the gate is embedded in the second insulating layer and is formed on the first insulating layer.

3. A MOS transistor comprising:
    an insulating substrate, wherein the insulating substrate is formed on an entire top surface of a substrate;
    a gate embedded in the insulating substrate, wherein a top surface of the gate is not covered by the insulating layer, wherein the gate is formed in a trench in the insulating substrate, and wherein a bottom surface of the insulating layer is lower than a bottom surface of the gate;

a gate oxide layer formed on top of the insulating substrate and the gate, wherein the top surface of the gate is in contact with the gate oxide layer;

a silicon layer formed on the gate oxide layer; and a source region and a drain region formed in the silicon layer to be in contact with the gate oxide layer.

4. The MOS transistor according to claim 3, wherein the insulating layer includes:

a first insulating layer formed on the insulating substrate; and a second insulating layer formed on the first insulating layer, wherein the gate is embedded in the second insulating layer and is formed on the first insulating layer, wherein the gate oxide layer is in contact with an entire bottom edge of both the source region and drain region.

5. The MOS transistor according to claim 1, wherein the insulating layer is a single insulating layer formed on the substrate, wherein the bottom surface of the gate is not in contact with the top surface of the substrate.

6. The MOS transistor according to claim 1, wherein the top surface of the gate is equal in height to the top surface of the insulating layer.

7. The MOS transistor according to claim 1, wherein the top surface of the gate is higher than the top surface of the insulating layer.

8. The MOS transistor according to claim 1, wherein the top surface of the gate is lower than the top surface of the insulating layer.

9. The MOS transistor according to claim 3, wherein the insulating substrate is a single insulating layer, wherein the gate is not exposed to a lower portion of the insulating substrate.

* * * * *